(12) United States Patent
Wang et al.

(10) Patent No.: US 12,527,179 B2
(45) Date of Patent: Jan. 13, 2026

(54) DISPLAY PANEL, DISPLAY DEVICE, AND MANUFACTURING METHOD FOR DISPLAY PANEL

(71) Applicants: Chengdu BOE Optoelectronics Technology Co., Ltd., Sichuan (CN); BOE Technology Group Co., Ltd., Beijing (CN)

(72) Inventors: Binyan Wang, Beijing (CN); Weiyun Huang, Beijing (CN); Tiaomei Zhang, Beijing (CN); Yao Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 516 days.

(21) Appl. No.: 17/921,607

(22) PCT Filed: May 10, 2021

(86) PCT No.: PCT/CN2021/092722
§ 371 (c)(1),
(2) Date: Oct. 26, 2022

(87) PCT Pub. No.: WO2021/244228
PCT Pub. Date: Dec. 9, 2021

(65) Prior Publication Data
US 2023/0165081 A1  May 25, 2023

(30) Foreign Application Priority Data
Jun. 2, 2020 (CN) .................. 202010490145.X

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC .... H10D 86/443; H10D 86/60; H10D 86/411; H10D 86/441; H10D 86/0231;
(Continued)

(56) References Cited

U.S. PATENT DOCUMENTS

2004/0080263 A1* 4/2004 Yamazaki ............. G02F 1/1368
  313/499
2016/0204124 A1* 7/2016 Yen ...................... H10D 86/441
  257/40

(Continued)

FOREIGN PATENT DOCUMENTS

CN   109767689 A   5/2019
CN   110780501 A   2/2020
(Continued)

OTHER PUBLICATIONS

PCT/CN2021/092722 international search report.

*Primary Examiner* — Shaheda A Abdin
(74) *Attorney, Agent, or Firm* — IPro, PLLC

(57) ABSTRACT

A display panel (1), a display device, and a manufacturing method for the display panel (1). The display panel (1) comprises a base substrate (100). The base substrate (100) is provided with a first metal layer (001), a second metal layer (002), and a third metal layer (003) thereon. The display panel (1) further comprises traces. The traces comprise a first trace extending in a first direction, and a second trace extending in a second direction. The first trace comprises a first sub-trace portion (011), a second sub-trace portion (021), a first auxiliary portion (012), and a second auxiliary portion (022). The second trace comprises a third sub-trace portion (031) and a third auxiliary portion (032). The first direction is different from the second direction. The first (Continued)

sub-trace portion (011) and the second sub-trace portion (021) are located at the third metal layer (003).

19 Claims, 8 Drawing Sheets

(58) Field of Classification Search
CPC ............. H10K 59/131; H10K 59/1213; H10K 2102/311; H10K 77/11; H10K 59/1201; H10K 59/1216; H10K 59/65
See application file for complete search history.

(56) References Cited

U.S. PATENT DOCUMENTS

2017/0003716 A1    1/2017  Chong et al.
2021/0296612 A1*  9/2021  Kim .................. H10K 50/8426

FOREIGN PATENT DOCUMENTS

| CN | 111176040 A | 5/2020 |
| CN | 111599852 A | 8/2020 |

\* cited by examiner

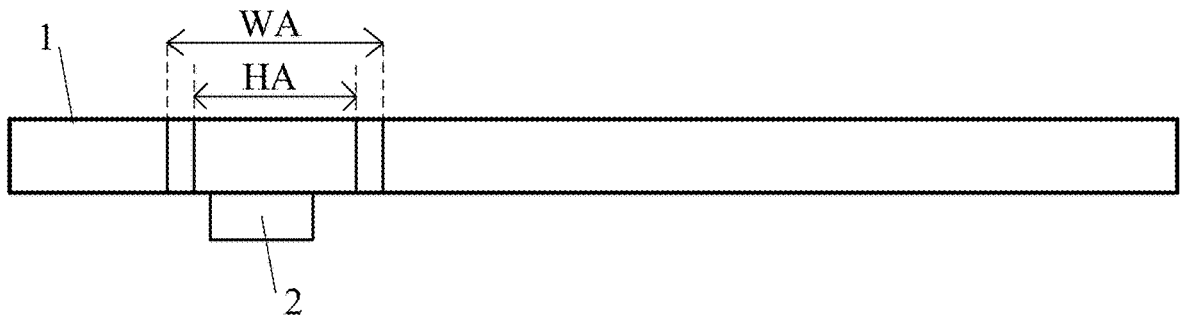

Fig. 11

| Provide a substrate, and manufacture a first insulating layer, a first metal layer, a second insulating layer, a second metal layer, a third insulating layer, a third metal layer, a fourth insulating layer and a fifth insulating layer on the substrate sequentially |
|---|

| Manufacture a first wire extending in a first direction in the non-hole area, where the first wire includes a first sub-wire portion, a second sub-wire portion, a first auxiliary portion and a second auxiliary portion; and manufacture a second wire extending in a second direction in the non-hole area, where the second wire includes a third sub-wire portion and a third auxiliary portion, and the first direction is different from the second direction; where the third sub-wire portion and the first auxiliary portion are manufactured at the first metal layer, the second auxiliary portion is manufactured at the second metal layer, and the first sub-wire portion, the second sub-wire portion and the third auxiliary portion are manufactured at the third metal layer; and at least some of the first auxiliary portion, the second auxiliary portion or the third auxiliary portion are manufactured in the winding area |
|---|

Fig. 12

DISPLAY PANEL, DISPLAY DEVICE, AND MANUFACTURING METHOD FOR DISPLAY PANEL

CROSS REFERENCE TO RELATED APPLICATION

The present disclosure is a National Stage of International Application No. PCT/CN2021/092722, filed on May 10, 2021, which claims the priority to Chinese Patent Application No. 202010490145.X, filed to China National Intellectual Property Administration on Jun. 2, 2020, which are incorporated in their entirety herein by reference.

FIELD

The present disclosure relates to the technical field of display, and in particular to a display panel, a display device, and a manufacturing method for the display panel.

BACKGROUND

As display electronic products such as mobile phones develop, a screen-to-body ratio of a display screen tends to increase. For full-screen display, a hole area can be arranged on the display screen, and a wire structure surrounding the hole area needs to be wound.

SUMMARY

In a first aspect, an embodiment of the present disclosure provides a display panel. The display panel includes a substrate, and a first metal layer, a second metal layer and a third metal layer that are stacked on the substrate sequentially, and further includes wires, where the wires include: a first wire extending in a first direction, where the first wire includes a first sub-wire portion, a second sub-wire portion, a first auxiliary portion and a second auxiliary portion; and a second wire extending in a second direction, the second wire including a third sub-wire portion and a third auxiliary portion; where the first direction is different from the second direction; the first sub-wire portion and the second sub-wire portion are at the third metal layer, the first auxiliary portion is at the first metal layer, the second auxiliary portion is at the second metal layer, the third sub-wire portion is at the first metal layer, and the third auxiliary portion is at the third metal layer; the substrate of the display panel further includes a hole area and a non-hole area, and the non-hole area includes a winding area; and the first auxiliary portion, the second auxiliary portion, and the third auxiliary portion each include a winding structure provided within the winding area.

In a possible implementation, orthographic projections of the first auxiliary portion and the second auxiliary portion on the substrate are arranged alternately.

In a possible implementation, the first sub-wire portion is electrically connected to the first auxiliary portion through a first via hole; the second sub-wire portion is electrically connected to the second auxiliary portion through a second via hole; and the third sub-wire portion is electrically connected to the third auxiliary portion through a third via hole.

In a possible implementation, the second wire further includes a fourth sub-wire portion, and the fourth sub-wire portion is at the first metal layer.

In a possible implementation, the display panel further includes a fourth metal layer on one side of the third metal layer away from the substrate.

In a possible implementation, the second wire further includes a fourth auxiliary portion, and the fourth auxiliary portion is at the fourth metal layer; and the fourth auxiliary portion includes a winding structure in the winding area.

In a possible implementation, orthographic projections of the third auxiliary portion and the fourth auxiliary portion on the substrate are arranged alternately.

In a possible implementation, the display panel further includes: a first bridge portion at the third metal layer, where the first bridge portion is electrically connected to the fourth sub-wire portion through a fifth via hole.

In a possible implementation, the first bridge portion is electrically connected to the fourth auxiliary portion through a fourth via hole.

In a possible implementation, an orthographic projection of the fourth via hole on the substrate does not overlap an orthographic projection of the fifth via hole on the substrate.

In a possible implementation, the third sub-wire portion, the fourth sub-wire portion and the first auxiliary portion at the first metal layer are insulated from one another; the first sub-wire portion, the second sub-wire portion, the first bridge portion and the third auxiliary portion that are at the third metal layer are insulated from one another; and the first auxiliary portion, the second auxiliary portion, the third auxiliary portion and the fourth auxiliary portion are insulated from one another.

In a possible implementation, the display panel further includes: a first insulating layer between the first metal layer and the substrate, a second insulating layer between the first metal layer and the second metal layer, a third insulating layer between the second metal layer and the third metal layer, a fourth insulating layer on one side of the third metal layer away from the substrate, and a fifth insulating layer on one side of the fourth insulating layer away from the substrate.

In a possible implementation, the display panel further includes pixel units arranged in an array, where each of the pixel units includes a drive circuit and a storage capacitor, the drive circuit includes a thin film transistor, and the thin film transistor includes: an active layer on the substrate; a first gate insulating layer on one side of the active layer away from the substrate, where the first insulating layer includes the first gate insulating layer; a first gate on one side of the first gate insulating layer away from the substrate, where the first metal layer includes the first gate; an interlayer insulating layer on one side of the first gate away from the substrate, where the third insulating layer includes the interlayer insulating layer; a source-drain layer on one side of the interlayer insulating layer away from the substrate, where the third metal layer includes the source-drain layer; a passivation layer on one side of the source-drain layer away from the substrate, where the fourth insulating layer includes the passivation layer; and a planarization layer on one side of the passivation layer away from the substrate, where the fifth insulating layer includes the planarization layer.

In a possible implementation, the first via hole is a through hole at least penetrating the third insulating layer to cause the first sub-wire portion to be electrically connected to the first auxiliary portion.

In a possible implementation, the second via hole is a through hole at least penetrating the third insulating layer to cause the second sub-wire portion to be electrically connected to the second auxiliary portion.

In a possible implementation, the third via hole is a through hole at least penetrating the third insulating layer to cause the third sub-wire portion to be electrically connected to the third auxiliary portion.

In a possible implementation, the fourth via hole is a through hole at least penetrating the fourth insulating layer and the fifth insulating layer to cause the first bridge portion to be electrically connected to the fourth auxiliary portion.

In a possible implementation, the fifth via hole is a through hole at least penetrating the third insulating layer to cause the fourth sub-wire portion to be electrically connected to the first bridge portion.

In a possible implementation, the first sub-wire portion and the second sub-wire portion are electrically connected to sources or drains of thin film transistors of different pixel units separately and are configured to transmit data signals.

In a possible implementation, the third sub-wire portion is electrically connected to the first gate of the thin film transistor and configured to transmit a first gate signal.

The fourth sub-wire portion is configured to transmit a light-emitting control signal.

In a possible implementation, a first bridge portion electrically connected to a fourth sub-wire portion configured to transmit an $(n+1)^{th}$ row of light-emitting control signal is electrically connected to a fourth sub-wire portion configured to transmit an $n^{th}$ row of light-emitting control signal by means of a second bridge portion, where n is an integer greater than or equal to 1.

In a possible implementation, the second bridge portion is at the third metal layer, the second bridge portion is provided with a sixth via hole, and the sixth via hole is a via hole at least penetrating the third insulating layer to cause the fourth sub-wire portion configured to transmit the $n^{th}$ row of light-emitting control signal to be electrically connected to the second bridge portion.

In a possible implementation, the fourth sub-wire portion configured to transmit the $n^{th}$ row of light-emitting control signal is electrically connected to the second bridge portion through the sixth via hole, the first bridge portion and the second bridge portion that are electrically connected to the fourth sub-wire portion configured to transmit the $(n+1)^{th}$ row of light-emitting control signal are electrically connected to the fourth auxiliary portion jointly through the fourth via hole, and an orthographic projection of the sixth via hole on the substrate does not overlap an orthographic projection of the fourth via hole on the substrate.

In a possible implementation, projections of the fourth sub-wire portion and the winding area on the substrate do not overlap with each other, and the fourth sub-wire portion configured to transmit one row of light-emitting control signal is cut off in the winding area.

In a possible implementation, the second wire further includes a fifth sub-wire portion.

In a possible implementation, the fifth sub-wire portion is configured to transmit a reset signal.

In a possible implementation, a fifth sub-wire portion configured to transmit an $(m+1)^{th}$ row of reset signal is electrically connected to a third sub-wire portion configured to transmit an $m^{th}$ row of first gate signal by means of the third bridge portion, where m is an integer greater than equal to 1.

In a possible implementation, the third bridge portion is at the third metal layer, the third bridge portion is provided with a seventh via hole and an eighth via hole, the seventh via hole is a via hole at least penetrating the third insulating layer to cause the third sub-wire portion configured to transmit the $m^{th}$ row of first gate signal to be electrically connected to the third bridge portion, and the eighth via hole is a via hole at least penetrating the third insulating layer to cause the fifth sub-wire portion configured to transmit the $(m+1)^{th}$ row of reset signal to be electrically connected to the third bridge portion.

In a possible implementation, the third bridge portion is electrically connected to the third auxiliary portion through the seventh via hole or the eighth via hole.

In a possible implementation, at least some of the first via hole, the second via hole, the third via hole, the fourth via hole, the fifth via hole, the sixth via hole, the seventh via hole, or the eighth via hole are in a multi-via-hole parallel structure.

In a possible implementation, the storage capacitor includes a first plate electrode and a second plate electrode, the first plate electrode is at the first metal layer, the second plate electrode is at the second metal layer, a second gate insulating layer is between the first plate electrode and the second plate electrode, and the second insulating layer includes the second gate insulating layer.

In a possible implementation, a shape of the hole area includes a circle, an oval, a triangle, a quadrangle, or an irregular shape.

In a second aspect, an embodiment of the present disclosure provides a display device. The display device includes the above display panel provided in any one of the embodiments of the present disclosure.

In a possible implementation, the display device further includes a sensor below the hole area.

In a possible implementation, the sensor includes a camera, an infrared sensor, a fingerprint detection unit, and a pressure sensing unit.

In a third aspect, an embodiment of the present disclosure provides a manufacturing method for a display panel. The manufacturing method includes: providing a substrate, and manufacturing a first insulating layer, a first metal layer, a second insulating layer, a second metal layer, a third insulating layer, a third metal layer, a fourth insulating layer and a fifth insulating layer on the substrate sequentially, where the substrate includes a hole area and a non-hole area; manufacturing a first wire extending in a first direction in the non-hole area, where the first wire includes a first sub-wire portion, a second sub-wire portion, a first auxiliary portion and a second auxiliary portion; and manufacturing a second wire extending in a second direction in the non-hole area, where the second wire includes a third sub-wire portion and a third auxiliary portion, and the first direction is different from the second direction; where the third sub-wire portion and the first auxiliary portion are manufactured at the first metal layer, the second auxiliary portion is manufactured at the second metal layer, and the first sub-wire portion, the second sub-wire portion and the third auxiliary portion are manufactured at the third metal layer; and the non-hole area includes a winding area, and at least some of the first auxiliary portion, the second auxiliary portion or the third auxiliary portion are manufactured in the winding area.

In a possible implementation, the method further includes: manufacturing an active layer, a first gate insulating layer, a first gate, an interlayer insulating layer, a source-drain layer, a passivation layer and a planarization layer on the substrate sequentially; where the first gate insulating layer is a part of the first insulating layer, the first gate is a part of the first metal layer, the interlayer insulating layer is a part of the third insulating layer, the source-drain layer is a part of the third metal layer, the passivation layer is a part of the fourth insulating layer, and the planarization layer is a part of the fifth insulating layer; and the manufacturing method for a display panel further includes: manufacturing a first via hole at least penetrating the third insulating layer to cause the first sub-wire portion to be electrically connected to the first auxiliary portion; manufacturing a second via hole at least penetrating the third insulating layer to cause the second sub-wire portion to be electrically connected to the second auxiliary portion; and manufacturing a third via hole at least penetrating the third insulating layer to cause the third sub-wire portion to be electrically connected to the third auxiliary portion.

In a possible implementation, the method further includes: manufacturing a fourth metal layer on one side of the third metal layer away from the substrate, and manufacturing a fourth auxiliary portion at the fourth metal layer; wherein the manufacturing the second wire extending in the second direction in the non-hole area further includes: manufacturing a fourth sub-wire portion extending in the second direction; manufacturing a first bridge portion and a second bridge portion at the third metal layer; manufacturing a sixth via hole at least penetrating the third insulating layer to cause an $n^{th}$ row of fourth sub-wire portion to be electrically connected to the second bridge portion; manufacturing a fifth via hole at least penetrating the third insulating layer to cause an $(n+1)^{th}$ row of fourth sub-wire portion to be electrically connected to the first bridge portion; and manufacturing a fourth via hole at least penetrating the fourth insulating layer and the fifth insulating layer to cause the first bridge portion and the second bridge portion to be electrically connected to the fourth auxiliary portion, where n is an integer greater than or equal to 1.

In a possible implementation, the method further includes: the manufacturing the second wire extending in the second direction in the non-hole area includes: manufacturing a fifth sub-wire portion extending in the second direction; manufacturing a third bridge portion at the third metal layer; manufacturing a seventh via hole at least penetrating the third insulating layer to cause an $m^{th}$ row of third sub-wire portion to be electrically connected to the third bridge portion; and manufacturing an eighth via hole at least penetrating the third insulating layer to cause an $(m+1)^{th}$ row of fifth sub-wire portion to be electrically connected to the third bridge portion; where the third bridge portion is electrically connected to the third auxiliary portion through the seventh via hole or the eighth via hole, and m is an integer greater than or equal to 1.

BRIEF DESCRIPTION OF THE DRAWINGS

FIG. 11 is a schematic diagram of a display device according to an embodiment of the present disclosure.

FIG. 12 is a schematic diagram of a manufacturing method for a display panel according to an embodiment of the present disclosure.

DETAILED DESCRIPTION OF THE EMBODIMENTS

In order to make the objectives, technical solutions, and advantages in the embodiments of the present disclosure clearer, the technical solutions in the embodiments of the present disclosure will be clearly and completely described below with reference to the accompanying drawings in the embodiments of the present disclosure. It is obvious that the described embodiments are some rather than all of the embodiments of the present disclosure. Based on the described embodiments of the present disclosure, all other embodiments obtained by a person of ordinary skill in the art without making inventive efforts fall within the scope of protection of the present disclosure.

Unless otherwise defined, technical or scientific terms used herein should have ordinary meanings as understood by those of ordinary skill in the art to which the present disclosure belongs. "First", "second" and similar words used in the present disclosure do not mean any order, quantity or importance, but are only used for distinguishing different components. Similarly, "comprise", "include" and similar words are intended to mean that an element or item in front of the word encompasses elements or items that are listed behind the word and equivalents thereof, but do not exclude other elements or items. "Connect", "connected" and similar words are not limited to a physical or mechanical connection, but can include an electrical connection, whether direct or indirect. "Up", "down", "left", "right", etc. are merely configured to indicate relative position relations, and when the absolute position of an object described changes, the relative position can change accordingly.

In the description below, when an element or layer is described as being "on" or "connected to" another element or layer, it can be directly on or connected to another element or layer, or an intervening element or layer can be present. When an element or layer is described as being "on" "one side" of another element or layer, it can be directly on or connected to another element or layer, or an intervening element or layer can be present. However, when an element or layer is described as being "directly on" or "directly connected to" another element or layer, an intervening element or layer is absent. The term "and/or" includes any and all combinations of one or more of the associated listed items.

Figure 1:
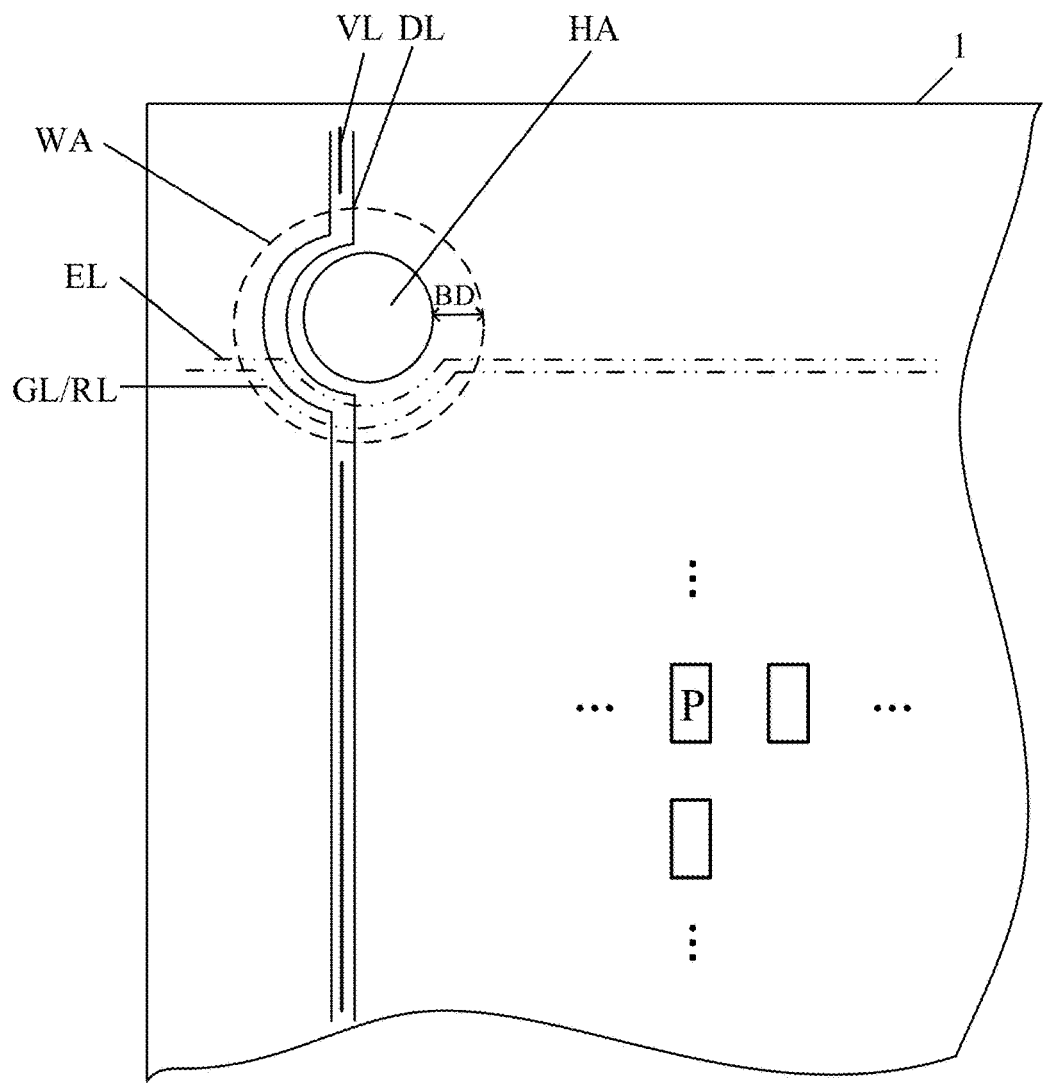
FIG. 1 is a schematic diagram of a display panel.

In order to pursue increase in a screen-to-body ratio of a display screen, punch-hole screens are increasingly used. As shown in FIG. 1, a hole area HA and a winding area WA surrounding the hole area are on a display panel 1, wires in the winding area WA is dense and no pixel unit is arranged. Therefore the winding area WA may not implement a display function, so as to form a non-displayable black edge around the hollowed area HA. The display panel is further provided with a plurality of data lines DL and a plurality of power lines VL extending in a first direction, and a plurality of gate lines GL, a plurality of reset signal lines RL and a plurality of light-emitting control signal lines EL extending in a second direction, and other wires (only one wire of each type is shown in the figure). In the winding area WA, when distances between the plurality of wires are very short, the wires are liable to interfere with each other. In order to guarantee enough distances between the wires, a border of the hole area HA will become larger, that is, BD in the figure becomes larger, which is not conducive to increase in the screen-to-body ratio of the display screen.

Figure 2:
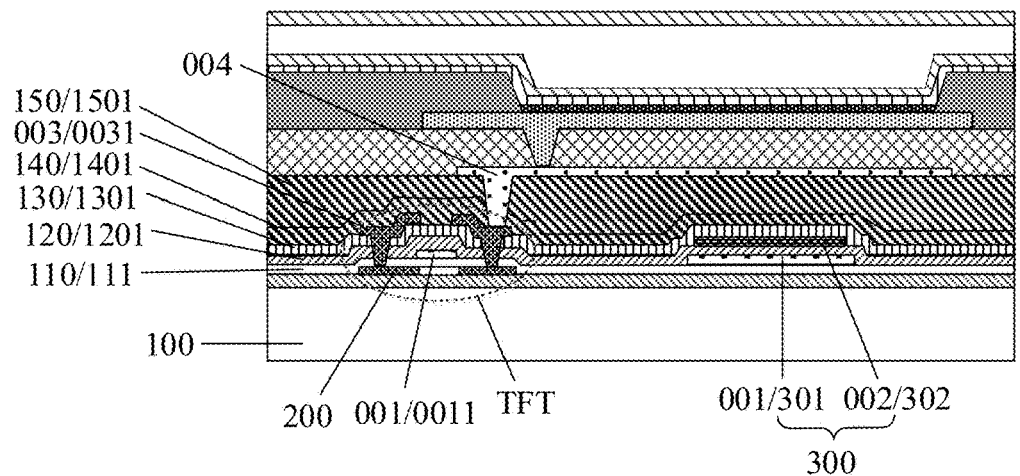
FIG. 2 is a schematic diagram of a sectional film layer of a display panel according to an embodiment of the present disclosure.

FIG. 2 is a diagram of a sectional film layer of a display panel in an embodiment of the present disclosure. In order to solve the problem, the embodiment of the present disclosure provides a display panel, as shown in FIG. 2. The display panel includes a substrate 100, a first metal layer 001, a second metal layer 002 and a third metal layer 003 are on the substrate. The second metal layer 002 is on one side of the first metal layer 001 away from the substrate 100, and the third metal layer 003 is on one side of the second metal layer 002 away from the substrate 100.

Figure 3:
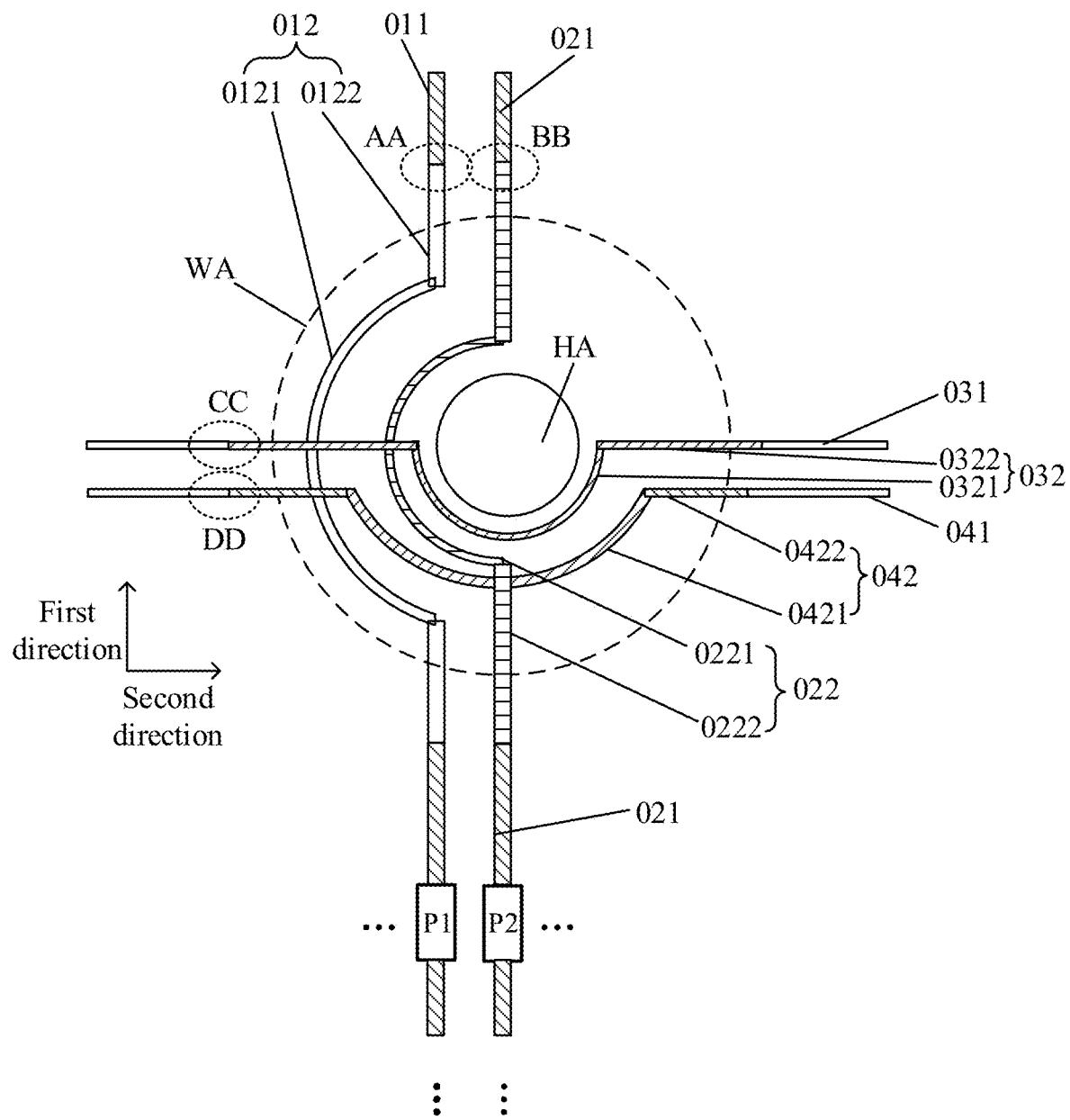
FIG. 3 is a partially-enlarged schematic top view of a winding area of a display panel according to an embodiment of the present disclosure.

FIG. 3 is a partially-enlarged top view a winding area of a display panel according to an embodiment of the present disclosure. As shown in FIG. 3, the display panel further includes wires, where the wires include a first wire extending in a first direction, the first wire including a first sub-wire portion 011, a first auxiliary portion 012, a second sub-wire portion 021 and a second auxiliary portion 022; the wires further include a second wire extending in a second direction, the second wire including a third sub-wire portion 031 and a third auxiliary portion 032; and the first direction is different from the second direction.

The first sub-wire portion 011 and the second sub-wire portion 021 are at the third metal layer 003, the first auxiliary portion 012 is at the first metal layer 001, the second auxiliary portion 022 is at the second metal layer 002, the third sub-wire portion 031 is at the first metal layer 001, and the third auxiliary portion 032 is at the third metal layer 003.

The first auxiliary portion 012 includes a first winding structure 0121 in the winding area WA and further includes a first connection structure 0122 between the first winding structure 0121 and the first sub-wire portion 011. The second auxiliary portion 022 includes a second winding structure in the winding area WA and further includes a second connection structure 0222 between the second winding structure 0221 and the second sub-wire portion 021. The third auxiliary portion 032 includes a third winding structure 0321 in the winding area WA, and further includes a third connection structure 0322 between the third winding structure 0321 and the third sub-wire portion 031.

Wire widths shown in the figures of the present disclosure are merely for clearer illustration and to distinguish different wires, are not representative of actual wire widths, and are not intended to be limiting of the present disclosure. Sizes and proportions of the hole area, the winding area, the display panel and other areas in the figures are merely schematic and are not intended to be limiting of the present disclosure.

Projections of the first auxiliary portion and the second auxiliary portion on the substrate are arranged alternately. As shown in FIG. 3, the orthographic projections of the first auxiliary portion 012 and the second auxiliary portion 022 on the substrate are arranged alternately.

In the embodiment of the present disclosure, the third sub-wire portion 031 at the first metal layer is switched to the third auxiliary portion 032 at the third metal layer, to carry out winding transmission in the winding area. The first sub-wire portion 011 at the third metal layer is switched to the first auxiliary portion 012 at the first metal layer, to carry out winding transmission in the winding area. The second sub-wire portion 021 at the third metal layer is switched to the second auxiliary portion 022 at the second metal layer, to carry out winding transmission in the winding area. In a direction from the hole area HA to an outer boundary of the winding area WA, the projections of the first auxiliary portion 012 and the second auxiliary portion 022 on the substrate are arranged alternately. In this way, the adjacent winding structures in the winding area are distributed on different metal layers, signal interference between adjacent wires is weakened, a distance between the adjacent wires may be shortened, and then the border of the hole area may be reduced on the premise that the number of the wires is not reduced.

Illustratively, the third sub-wire portion 031 originally at the first metal layer is switched to the third connection structure 0322 at the third metal layer and then is connected to the third winding structure 0321 to carry out winding transmission in the winding area. The first sub-wire portion 011 originally at the third metal layer is switched to the first connection structure 0122 at the first metal layer and then is connected to the first winding structure 0121 to carry out winding transmission in the winding area. The second sub-wire portion 021 originally at the third metal layer is switched to the second connection structure 0222 at the second metal layer and then is connected to the second winding structure 0221 to carry out winding transmission in the winding area. Projections of the first winding structure 0121 and the second winding structure 0221 on the substrate are arranged alternately. The adjacent winding structures in the winding area are distributed on different metal layers, signal interference between adjacent wires is weakened, a distance between the adjacent wires may be shortened, and then the border of the hole area may be reduced on the premise that the number of the wires is not reduced.

In the embodiment of the present disclosure, the first sub-wire portion is electrically connected to the first auxiliary portion through a first via hole, the second sub-wire portion is electrically connected to the second auxiliary portion through a second via hole, and the third sub-wire portion is electrically connected to the third auxiliary portion through a third via hole.

Figure 4A:
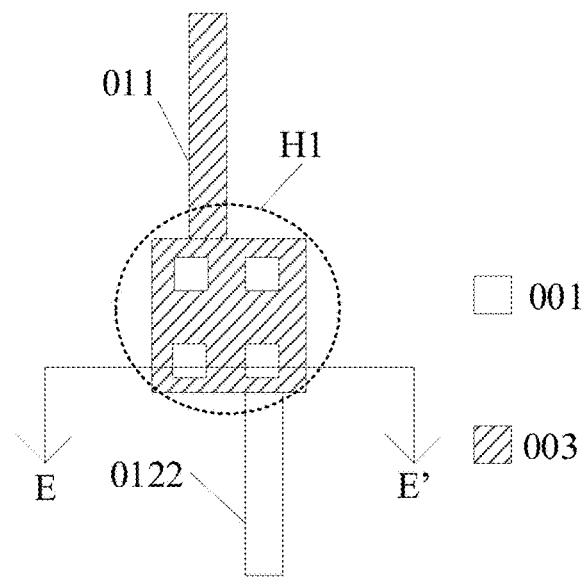
FIG. 4A is a partially-enlarged schematic top view of AA in FIG. 3.
Figure 4B:
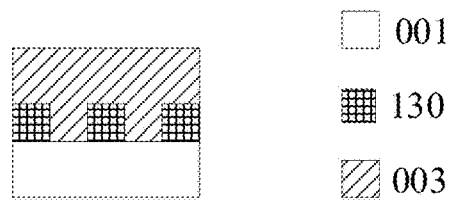
FIG. 4B is a schematic sectional diagram along line EE' in FIG. 4A.

Illustratively, at a dashed box AA in FIG. 3, the first sub-wire portion 011 is electrically connected to the first auxiliary portion 012 through the first via hole. FIG. 4A is a partially-enlarged top view at AA. FIG. 4B is a sectional view at EE' in FIG. 4A. In combination with FIGS. 4A and 4B, the first sub-wire portion 011 at the third metal layer 003 is electrically connected to the first connection structure 0122 of the first auxiliary portion 012 at the first metal layer 001 through the first via hole H1, such that the first sub-wire portion and the first auxiliary portion are electrically connected with each other. As shown in FIG. 4A, the first via hole H1 may be in a multi-via-hole parallel structure. With such design, metal of different layers may be better connected, when one via hole is bad, the other via holes may still guarantee a connection effect, but the present disclosure is not limited thereto, a single via hole may also implement electric connection.

Figure 5A:
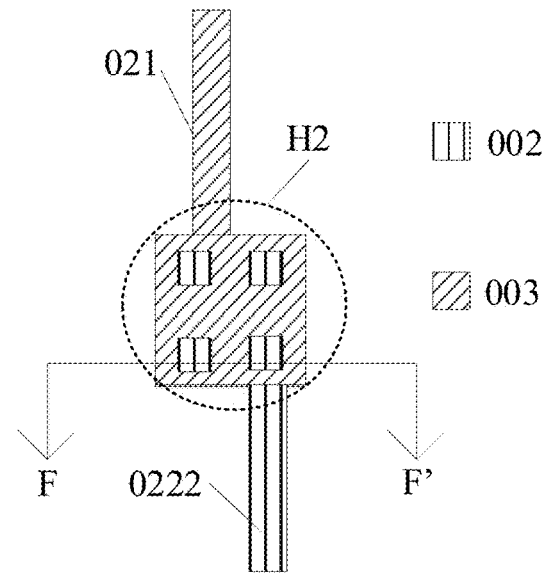
FIG. 5A is a partially-enlarged schematic top view of BB in FIG. 3.
Figure 5B:
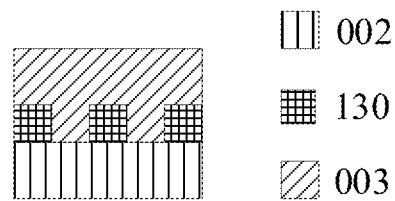
FIG. 5B is a schematic sectional diagram along line FF' in FIG. 5A.

Illustratively, at a dashed box BB in FIG. 3, the second sub-wire portion 021 is electrically connected to the second auxiliary portion 022 through the second via hole. FIG. 5A is a partially-enlarged top view at BB. FIG. 5B is a sectional view at FF' in FIG. 5A. In combination with FIGS. 5A and 5B, the second sub-wire portion 021 at the third metal layer 003 is electrically connected to the second connection structure 0222 of the second auxiliary portion 022 at the second metal layer 002 through the second via hole H2, such that the second sub-wire portion and the second auxiliary portion are electrically connected with each other. As shown in FIG. 5A, the second via hole H2 may be in a multi-via-hole parallel structure. With such design, metal of different layers may be better connected, when one via hole is bad, the other via holes may still guarantee a connection effect, but the present disclosure is not limited thereto, a single via hole may also implement electric connection.

Figure 6A:
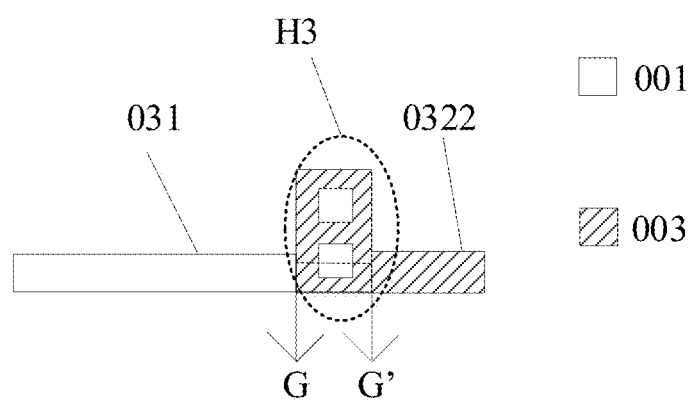
FIG. 6A is a partially-enlarged schematic top view of CC in FIG. 3.
Figure 6B:
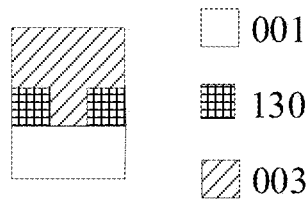
FIG. 6B is a schematic sectional diagram along line GG' in FIG. 6A.

Illustratively, at a dashed box CC in FIG. 3 the third sub-wire portion 031 is electrically connected to the third auxiliary portion 032 through the third via hole. FIG. 6A is a partially-enlarged top view at CC. FIG. 6B is a sectional view at GG' in FIG. 6A. In combination with FIGS. 6A and 6B, the third sub-wire portion 031 at the first metal layer 001 is electrically connected to the third connection structure 0322 of the third auxiliary portion 032 at the third metal layer 003 through the third via hole H3, such that the third sub-wire portion and the third auxiliary portion are electrically connected with each other. As shown in FIG. 6A, the third via hole H3 may be in a multi-via-hole parallel structure. With such design, metal of different layers may be better connected, when one via hole is bad, the other via holes may still guarantee a connection effect, but the present disclosure is not limited thereto, a single via hole may also implement electric connection.

In the embodiment of the present disclosure, as shown in FIG. 3, the second wire may further include a fourth sub-wire portion 041, and the fourth sub-wire portion 041 is at the first metal layer 001.

In the embodiment of the present disclosure, as shown in FIG. 2, the display panel may further include a fourth metal layer 004, and the fourth metal layer 004 is on one side of the third metal layer 003 away from the substrate 100.

In the embodiment of the present disclosure, as shown in FIG. 3, the second wire may further include a fourth auxiliary portion 042, and the fourth auxiliary portion 042 is at the fourth metal layer 004. The fourth auxiliary portion 042 includes a fourth winding structure 0421 in the winding area WA, and further includes a fourth connection structure 0422 between the fourth winding structure 0421 and the fourth sub-wire portion 041.

In the embodiment of the present disclosure, as shown in FIG. 3, orthographic projections of the third auxiliary portion 032 and the fourth auxiliary portion 042 on the substrate are arranged alternately. Specifically, orthographic projections of the third winding structure 0321 and the fourth winding structure 0421 on the substrate are arranged alternately.

In the embodiment of the present disclosure, the display panel further includes a first bridge portion, the first bridge portion is at the third metal layer, a fifth via hole is provided in the first bridge portion, and the fifth via hole makes the fourth sub-wire portion be electrically connected to the first bridge portion. The first bridge portion is electrically connected to the fourth auxiliary portion through a fourth via hole.

Figure 7A:
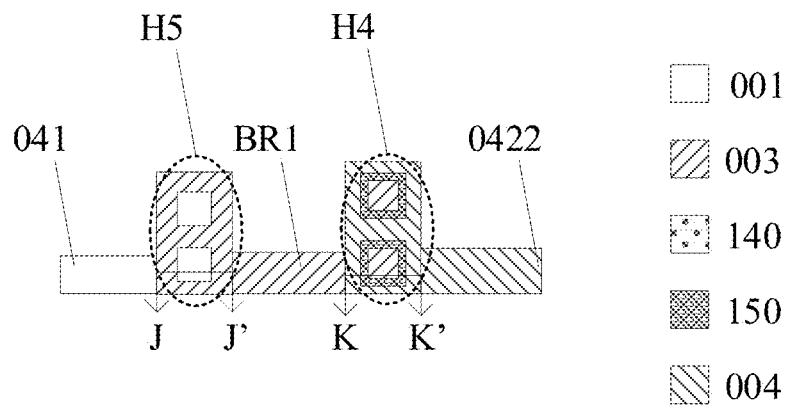
FIG. 7A is a partially-enlarged schematic top view of DD in FIG. 3.
Figure 7B:
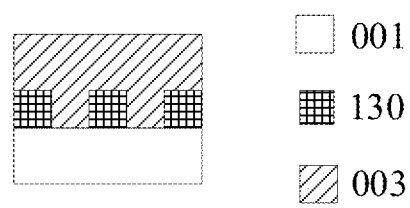
FIG. 7B is a schematic sectional diagram along line JJ' in FIG. 7A.
Figure 7C:
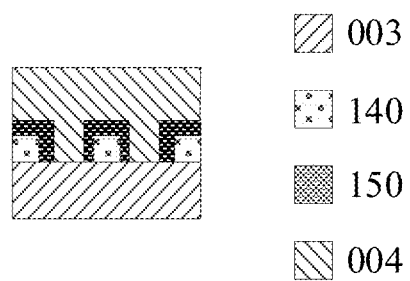
FIG. 7C is a schematic sectional diagram along line KK' in FIG. 7A.

Illustratively, at a dashed box DD in FIG. 3, the fourth sub-wire portion 041 is electrically connected to the fourth auxiliary portion 042 by means of a first bridge portion (the first bridge portion is not shown in FIG. 3). FIG. 7A is a partially-enlarged top view at DD in FIG. 3. FIG. 7B is a sectional view at JJ' in FIG. 7A. FIG. 7C is a sectional view at KK' in FIG. 7A. In combination with FIGS. 7A-7C, the fourth sub-wire portion 041 at the first metal layer 001 is electrically connected to the first bridge portion BR1 at the third metal layer 003 through the fifth via hole H5, and the first bridge portion BR1 is electrically connected to the fourth connection structure 0422 at the fourth metal layer 004 through the fourth via hole H4, such that the fourth sub-wire portion and the fourth auxiliary portion are electrically connected with each other. As shown in FIG. 7A, the fourth via hole H4 and the fifth via hole H5 may be in a multi-via-hole parallel structure. With such design, metal of different layers may be better connected, when one via hole is bad, the other via holes may still guarantee a connection effect, but the present disclosure is not limited thereto, a single via hole may also implement electric connection. Illustratively, as shown in FIG. 7A, orthographic projections of the fourth via hole H4 and the fifth via hole H5 on the substrate do not overlap with each other.

In the embodiment of the present disclosure, as shown in FIGS. 3 and 7A, the third sub-wire portion 031, the fourth sub-wire portion 041 and the first auxiliary portion 012 are all at the first metal layer 001, and are insulated from one another. The first sub-wire portion 011, the second sub-wire portion 021, the first bridge portion BR1 and the third auxiliary portion 032 are all at the third metal layer 003 and are insulated from one another. The first auxiliary portion 012, the second auxiliary portion 022, the third auxiliary portion 032 and the fourth auxiliary portion 042 are insulated from one another.

In the embodiment of the present disclosure, as shown in FIG. 2, one side of the first metal layer 001 facing the substrate 100 is further provided with a first insulating layer 110, one side of the first metal layer 001 away from the substrate is provided with a second insulating layer 120, one side of the second insulating layer 120 away from the substrate 100 is provided with the second metal layer 002, one side of the second metal layer 002 away from the substrate 100 is provided with a third insulating layer 130, one side of the third insulating layer 130 away from the substrate 100 is provided with the third metal layer 003, one side of the third metal layer 003 away from the substrate 100 is provided with a fourth insulating layer 140, and one side of the fourth insulating layer 140 away from the substrate 100 is provided with a fifth insulating layer 150.

In the embodiment of the present disclosure, as shown in FIGS. 1 and 2, the display panel further includes pixel units P arranged in an array, where each pixel unit P includes a drive circuit and a storage capacitor 300, each drive circuit includes a thin film transistor TFT, and each thin film transistor TFT includes: an active layer 200 on the substrate, a first gate insulating layer 111 on one side of the active layer 200 away from the substrate 100, a first gate 0011 on one side of the first gate insulating layer 111 away from the substrate, an interlayer insulating layer 1301 on one side of the first gate 0011 away from the substrate, a source-drain layer 0031 on one side of the interlayer insulating layer 1301 away from the substrate, a passivation layer 1401 on one side of the source-drain layer 0031 away from the substrate, and a planarization layer 1501 on one side of the passivation layer 1401 away from the substrate, where the first insulating layer 110 includes the first gate insulating layer 111, the first metal layer 001 includes the first gate 0011, the third insulating layer 130 includes the interlayer insulating layer 1301, the third metal layer 003 includes the source-drain layer 0031, the fourth insulating layer 140 includes the passivation layer 1401, and the fifth insulating layer 150 includes the planarization layer 1501.

In the embodiment of the present disclosure, as shown in FIGS. 4A-4B, 5A-5B, 6A-6B, 7A-7C, the first via hole H1 is a through hole at least penetrating the third insulating layer 130 to make the first sub-wire portion 011 be electrically connected to the first auxiliary portion 012 (the first connection structure 0122). The second via hole H2 is a through hole at least penetrating the third insulating layer 130 to make the second sub-wire portion 021 be electrically connected to the second auxiliary portion 022 (the second connection structure 0222). The third via hole H3 is a through hole at least penetrating the third insulating layer 130 to make the third sub-wire portion 031 be electrically connected to the third auxiliary portion 032 (the third connection structure 0322). The fourth via hole H4 is a through hole at least penetrating the fourth insulating layer 140 and the fifth insulating layer 150 to make the first bridge portion BR1 be electrically connected to the fourth auxiliary portion 042 (the fourth connection structure 0422). The fifth via hole H5 is a through hole at least penetrating the third insulating layer 130 to make the fourth sub-wire portion 041 be electrically connected to the first bridge portion BR1.

In the embodiment of the present disclosure, as shown in FIGS. 2 and 3, the first sub-wire portion 011 and the second sub-wire portion 021 are electrically connected to sources or drains of thin film transistors of different pixel units P1 and P2 separately and are configured to transmit data signals. The third sub-wire portion 031 is electrically connected to the first gate 0011 of the thin film transistor and is configured to transmit a first gate signal. The fourth sub-wire portion is configured to transmit a light-emitting control signal.

In the embodiment of the present disclosure, projections of the fourth sub-wire portion and the winding area on the substrate do not overlap with each other, and the fourth sub-wire portion configured to transmit one row of light-emitting control signal is cut off in the winding area.

Figure 8:
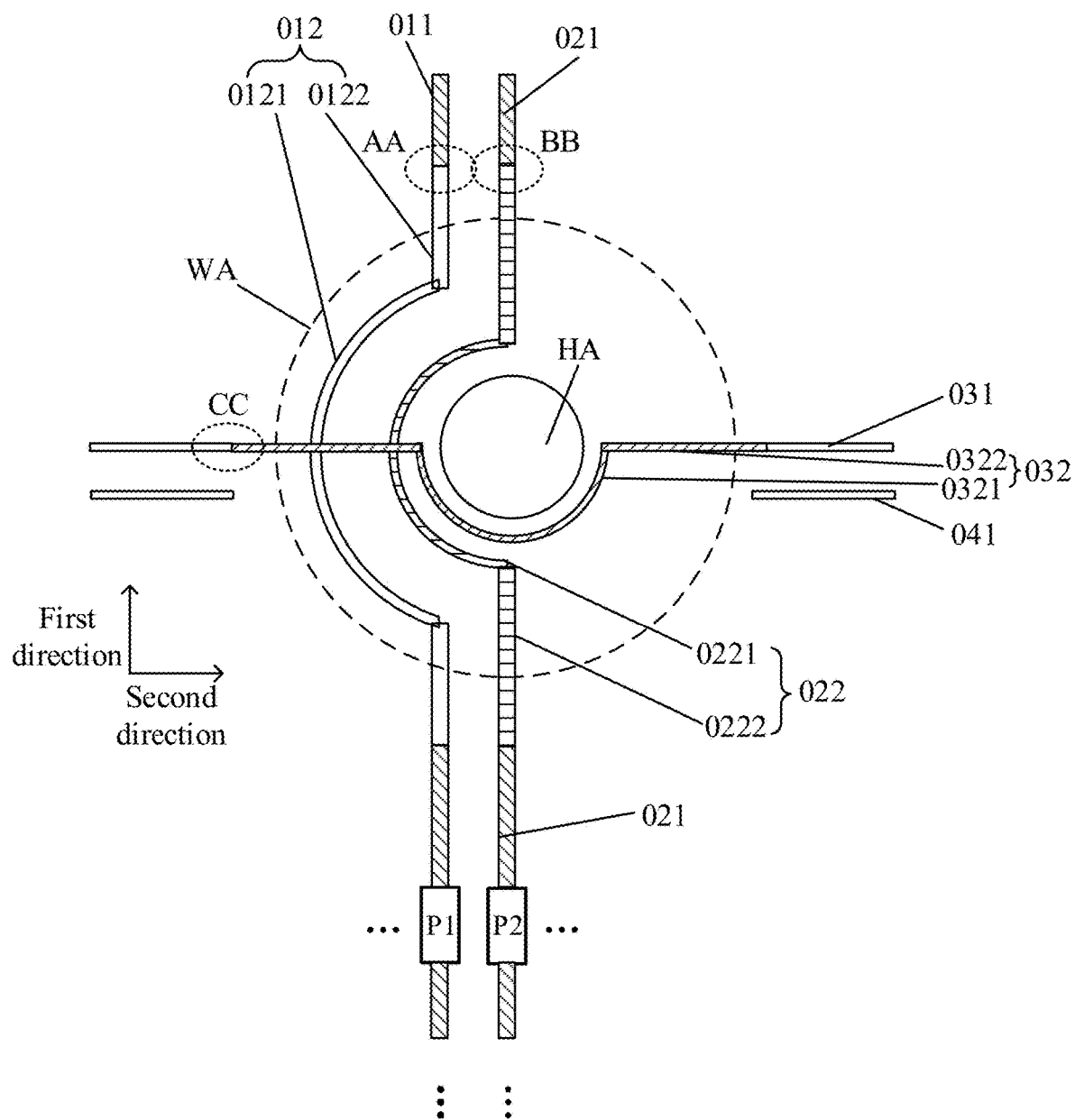
FIG. 8 is a partially-enlarged schematic top view of a winding area of another display panel according to an embodiment of the present disclosure.

Illustratively, as shown in FIG. 8, the projections of the fourth sub-wire portion 041 configured to transmit a light-emitting control signal and the winding area WA on the substrate do not overlap with each other, and the fourth sub-wire portion configured to transmit one row of light-emitting control signal is cut off in the winding area. This is because a light-emitting control signal (EM) gate on array (EM GOA) configured to give a light-emitting control signal EM may be manufactured on two sides of the display panel, and the EM GOA on the two sides of the display panel jointly provide the light-emitting control signal EM for the display panel, cut off of the fourth sub-wire portion in the winding area does not influence pixel units in this row to receive the light-emitting control signal EM. By means of the design, wires in the winding area WA may be reduced, and the border BD of the hole area may be reduced.

Figure 9A:
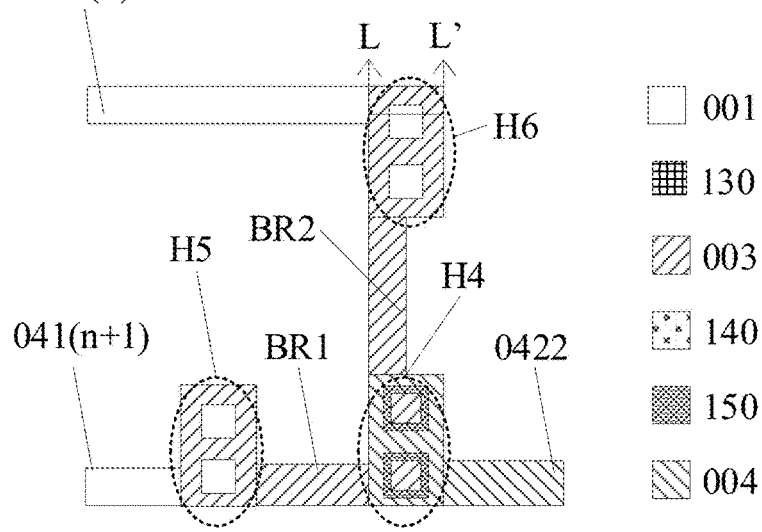
FIG. 9A is a partially-enlarged schematic top view illustrating that a fourth sub-wire portion of another display panel is electrically connected to a fourth auxiliary portion by means of a first bridge portion and a second bridge portion and is switched to another layer according to an embodiment of the present disclosure.
Figure 9B:
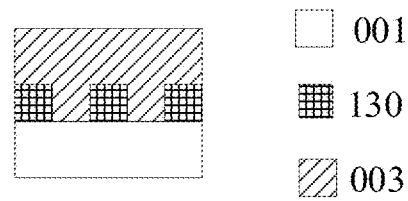
FIG. 9B is a schematic sectional diagram along line LL' in FIG. 9A.

In another embodiment of the present disclosure, as shown in FIG. 9, a first bridge portion BR1 electrically connected to a fourth sub-wire portion 041 (n+1) configured to transmit an $(n+1)^{th}$ row of light-emitting control signal is electrically connected to a fourth sub-wire portion 041(n) configured to transmit an $n^{th}$ row of light-emitting control signal by means of a second bridge portion BR2, and n is an integer greater than or equal to 1. The second bridge portion BR2 is at the third metal layer 003, the second bridge portion BR2 has a sixth via hole H6, and the sixth via hole H6 is a via hole at least penetrating the third insulating layer 130. FIG. 9B is a sectional view at LL' in FIG. 9A. As shown in FIG. 9B, the fourth sub-wire portion 041(n) configured to transmit the $n^{th}$ row of light-emitting control signal is electrically connected to the second bridge portion BR2 through the sixth via hole H6. As shown in the figure, the sixth via hole H6 may be in a multi-via-hole parallel structure. With such design, metal of different layers may be better connected, when one via hole is bad, the other via holes may still guarantee a connection effect, but the present disclosure is not limited thereto, a single via hole may also implement electric connection.

As shown in FIG. 9A, the fourth sub-wire portion 041(n) configured to transmit the $n^{th}$ row of light-emitting control signal is electrically connected to the second bridge portion BR2 through the sixth via hole H6, the first bridge portion BR1 and the second bridge portion BR2 that are electrically connected to the fourth sub-wire portion 041 (n+1) configured to transmit the $(n+1)^{th}$ row of light-emitting control signal are electrically connected to the fourth auxiliary portion 042 (the fourth connection structure 0422) jointly through the fourth via hole H4, and orthographic projections of the sixth via hole H6 and the fourth via hole H4 on the substrate do not overlap with each other. With such design, two adjacent rows of light-emitting control signals may be combined and transmitted in the winding area, so as to reduce the number of wires in the winding area, and reduce the border BD of the hole area.

Figure 10:
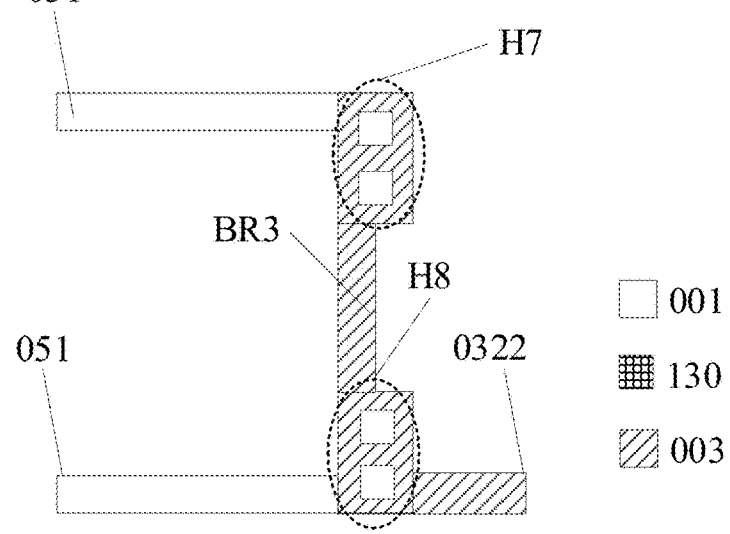
FIG. 10 is a partially-enlarged schematic top view illustrating that a third sub-wire portion and a fifth sub-wire portion of another display panel are electrically connected to each other by means of a third bridge portion and are switched to another layer according to an embodiment of the present disclosure.

In the embodiment of the present disclosure, as shown in FIG. 10, the second wire further includes a fifth sub-wire portion 051. The fifth sub-wire portion 051 is configured to transmit a reset signal Rst. The fifth sub-wire portion 051 configured to transmit an $(m+1)^{th}$ row of reset signal Rst is electrically connected to a third sub-wire portion 031 configured to transmit an $m^{th}$ row of first gate signal by means of the third bridge portion BR3, and m is an integer greater than equal to 1. The third bridge portion BR3 is at the third metal layer 003. The third bridge portion has a seventh via hole H7 and an eighth via hole H8. The seventh via hole H7 is a via hole at least penetrating the third insulating layer to make the third sub-wire portion 031 configured to transmit the $m^{th}$ row of first gate signal to be electrically connected the third bridge portion BR3. The eighth via hole H8 is a via hole at least penetrating the third insulating layer to make the fifth sub-wire portion 051 configured to transmit the $(m+1)^{th}$ row of reset signal be electrically connected to the third bridge portion BR3. The third bridge portion BR3 is electrically connected to the third auxiliary portion 032 (the third connection structure 0322) through the seventh via hole H7 or the eighth via hole H8. Only the case where the third bridge portion BR3 is electrically connected to the third connection structure 0322 through the eighth via hole H8 is shown, but the present disclosure is not limited thereto, and the seventh via hole H7 may also make the third bridge portion BR3 be electrically connected to the third connection structure 0322. With such design, a wire configured to transmit the m$^{th}$ row of first gate signal and a wire configured to transmit the (m+1)$^{th}$ row of reset signal may carry out combined transmission in the winding area, so as to reduce the number of wires in the winding area, and reduce the border BD of the hole area.

In the embodiment of the present disclosure, as shown in FIG. 10, the seventh via hole H7 and the eighth via hole H8 may be in a multi-via-hole parallel structure. With such design, metal of different layers may be better connected, when one via hole is bad, the other via holes may still guarantee a connection effect, but the present disclosure is not limited thereto, and a single via hole may also implement electric connection.

In the embodiment of the present disclosure, as shown in FIG. 2, each storage capacitor 300 includes a first plate electrode 301 and a second plate electrode 302, the first plate electrode 301 is at the first metal layer 001, the second plate electrode 302 is at the second metal layer 002, a second gate insulating layer 1201 is between the first plate electrode 301 and the second plate electrode 302, and the second insulating layer 120 includes the second gate insulating layer 1201.

In the embodiment of the present disclosure, a shape of the hole area includes a circle, an oval, a triangle, a quadrangle, or an irregular shape, but is not limited thereto. Specifically, the shape of the hole area may be designed according to a shape, an appearance, or other conditions of a product, and is not limited by the present disclosure. The shape of the winding area may be determined according to the shape of the hole area and may also be different from the shape of the hole area, and is not limited by the present disclosure. Preferably, the hole area and the winding area are the same in shape and are both of a circular or oval, and such a shape is conducive to wire winding.

In the embodiment of the present disclosure, as shown in FIG. 1, the power line VL may include a high-level power line VDD, and the power line VL is connected to a driving integrated circuit (IC) (not shown in the figure) provided on two sides of the display panel and transmits a power signal given by the driving IC, such that the power line VL may be cut off in the winding area WA without influencing the transmission of the power signal. With such design, the number of wires in the wire winding area may be reduced to some extent, and the border BD of the hole area may be reduced.

According to the embodiment provided in the present disclosure, parts of the first wire and the second wire in the winding area are switched into different metal layers, such that the adjacent wires in the winding area are distributed at the different metal layers, signal interference between the wires may be reduced, the wires may be more densely distributed, and therefore, the border of the hole area is reduced on the premise that the wires are not reduced. In addition, the embodiment provided in the present disclosure proposes that the fifth sub-wire portion configured to transmit the (m+1)$^{th}$ row of reset signal and the third sub-wire portion configured to transmit the m$^{th}$ row of first gate signal are combined for transmission in the winding area, such that the number of the wires in the winding area may be reduced, and the border of the hole area may be reduced. Moreover, the embodiment provided in the present further proposes that the fourth sub-wire portion configured to transmit the light-emitting control signal is cut off in the winding area, such that the number of the wires in the winding area may be further reduced, and a smaller border of the hole area may be obtained. The embodiment provided in the present disclosure is favorable for full-screen display.

According to the embodiment of the present disclosure, the display panel includes one hole area as an example, but the present disclosure is not limited thereto, one, two or more hole areas may be provided in the display panel, and wires surrounding different hole areas may use the design of the present disclosure.

Based on the same inventive concept, an embodiment of the present disclosure further provides a display device. As shown in FIG. 11, the display device includes the display panel provided in any one of the above embodiments and a sensor below the hole area. The sensor includes a camera, an infrared sensor, a fingerprint detection unit, and a pressure sensing unit.

Illustratively, as shown in FIG. 11, the display device includes a display panel 1 and a sensor 2, where the sensor 2 is below the hole area HA, then the sensor may better receive signals from outside the display panel without being influenced by the display panel itself. For example, the sensor may include a camera, an infrared sensor, a fingerprint detection unit and a pressure sensing unit, but is not limited thereto. As an example of the sensor being a camera, the camera is below the hole area, such that the camera is not interfered by the pixel units in the display area, and may take clearer photos.

The display device provided in the embodiment of the present disclosure may be any product or component with a display function, such as a mobile phone, a tablet computer, a television, a display, a notebook computer, a digital photo frame and a navigator. Other essential components of the display device will be understood by those of ordinary skill in the art, and are not repeated herein, nor are they intended to be limiting of the present disclosure.

Based on the same inventive concept, an embodiment of the present disclosure further provides a manufacturing method for a display device. As shown in FIG. 12, the manufacturing method specifically includes the following.

A substrate is provided, and a first insulating layer, a first metal layer, a second insulating layer, a second metal layer, a third insulating layer, a third metal layer, a fourth insulating layer and a fifth insulating layer are sequentially manufactured on the substrate.

The substrate of the display panel includes a hole area and a non-hole area; manufacture a first wire extending in a first direction in the non-hole area, where the first wire includes a first sub-wire portion, a second sub-wire portion, a first auxiliary portion and a second auxiliary portion; and manufacture a second wire extending in a second direction in the non-hole area, where the second wire includes a third sub-wire portion and a third auxiliary portion, and the first direction is different from the second direction.

The third sub-wire portion and the first auxiliary portion are manufactured at the first metal layer, the second auxiliary portion is manufactured at the second metal layer, and the first sub-wire portion, the second sub-wire portion and the third auxiliary portion are manufactured at the third metal layer.

The non-hole area includes a winding area, and at least some of the first auxiliary portion, the second auxiliary portion or the third auxiliary portion are manufactured in the winding area.

The manufacturing method for a display panel provided in the embodiment of the disclosure further includes: manufacturing a thin film transistor on the substrate, where this step by the following.

An active layer, a first gate insulating layer, a first gate, an interlayer insulating layer, a source-drain layer, a passivation layer and a planarization layer are sequentially manufactured on the substrate. The first gate insulating layer is a part of the first insulating layer, the first gate is a part of the first metal layer, the interlayer insulating layer is a part of the third insulating layer, the source-drain layer is a part of the third metal layer, the passivation layer is a part of the fourth insulating layer, and the planarization layer is a part of the fifth insulating layer.

The manufacturing method for a display panel further includes: manufacturing a first via hole at least penetrating the third insulating layer to make the first sub-wire portion be electrically connected to the first auxiliary portion; manufacturing a second via hole at least penetrating the third insulating layer to make the second sub-wire portion be electrically connected to the second auxiliary portion; and manufacturing a third via hole at least penetrating the third insulating layer to make the third sub-wire portion be electrically connected to the third auxiliary portion.

The manufacturing method for a display panel provided in the embodiment of the disclosure further includes: manufacturing a fourth metal layer on one side of the third metal layer away from the substrate, and manufacturing a fourth auxiliary portion at the fourth metal layer.

The step of manufacturing the second wire extending in the second direction in the non-hole area further includes: manufacturing a fourth sub-wire portion extending in the second direction; manufacturing a first bridge portion and a second bridge portion at the third metal layer; manufacturing a sixth via hole at least penetrating the third insulating layer to make an $n^{th}$ row of fourth sub-wire portion be electrically connected to the second bridge portion; manufacturing a fifth via hole at least penetrating the third insulating layer to make an $(n+1)^{th}$ row of fourth sub-wire portion be electrically connected to the first bridge portion; and manufacturing a fourth via hole at least penetrating the fourth insulating layer and the fifth insulating layer to make the first bridge portion and the second bridge portion be electrically connected to the fourth auxiliary portion. Where n is an integer greater than or equal to 1.

In the manufacturing method for a display panel provided in the embodiment of the disclosure, the step of manufacturing the second wire extending in the second direction in the non-hole area further includes: manufacturing a fifth sub-wire portion extending in the second direction; manufacturing a third bridge portion at the third metal layer; manufacturing a seventh via hole at least penetrating the third insulating layer to make an $m^{th}$ row of third sub-wire portion be electrically connected to the third bridge portion; and manufacturing an eighth via hole at least penetrating the third insulating layer to make an $(m+1)^{th}$ row of fifth sub-wire portion be electrically connected to the third bridge portion. The third bridge portion is electrically connected to the third auxiliary portion through the seventh via hole or the eighth via hole, and m is an integer greater than or equal to 1.

Apparently, those skilled in the art can make various modifications and variations to the present disclosure without departing from the spirit and scope of the present disclosure. In this way, if amendments and variations to the present disclosure fall within the scope of the claims of the present disclosure and the equivalents thereof, it is intended that the present disclosure also encompasses these amendments and variations.

What is claimed is:

1. A display panel, comprising: a substrate; a first metal layer, a second metal layer and a third metal layer that are stacked on the substrate sequentially; a first insulating layer between the first metal layer and the substrate; a second insulating layer between the first metal layer and the second metal layer; a third insulating layer between the second metal layer and the third metal layer; a fourth insulating layer on one side of the third metal layer away from the substrate; and a fifth insulating layer on one side of the fourth insulating layer away from the substrate; and further comprising wires; wherein the wires comprise:

a first wire extending in a first direction, wherein the first wire comprises a first sub-wire portion, a second sub-wire portion, a first auxiliary portion and a second auxiliary portion; and a second wire extending in a second direction, wherein the second wire comprises a third sub-wire portion and a third auxiliary portion;

wherein the first direction is different from the second direction;

the first sub-wire portion and the second sub-wire portion are at the third metal layer, the first auxiliary portion is at the first metal layer, the second auxiliary portion is at the second metal layer, the third sub-wire portion is at the first metal layer, and the third auxiliary portion is at the third metal layer;

the substrate comprises a hole area and a non-hole area, and the non-hole area comprises a winding area; and the first auxiliary portion, the second auxiliary portion, and the third auxiliary portion each comprise a winding structure provided within the winding area.

2. The display panel according to claim 1, wherein orthographic projections of the first auxiliary portion and the second auxiliary portion on the substrate are arranged alternately; the first sub-wire portion is electrically connected to the first auxiliary portion through a first via hole; the second sub-wire portion is electrically connected to the second auxiliary portion through a second via hole; the third sub-wire portion is electrically connected to the third auxiliary portion through a third via hole; and the second wire further comprises a fourth sub-wire portion, and the fourth sub-wire portion is at the first metal layer.

3. The display panel according to claim 2, further comprising a fourth metal layer on one side of the third metal layer away from the substrate; and the second wire further comprises a fourth auxiliary portion, the fourth auxiliary portion is at the fourth metal layer, and the fourth auxiliary portion comprises a winding structure in the winding area.

4. The display panel according to claim 3, wherein orthographic projections of the third auxiliary portion and the fourth auxiliary portion on the substrate are arranged alternately; the display panel further comprises a first bridge portion at the third metal layer, wherein the first bridge portion is electrically connected to the fourth sub-wire portion through a fifth via hole; the first bridge portion is electrically connected to the fourth auxiliary portion through a fourth via hole; and an orthographic projection of the fourth via hole on the substrate does not overlap an orthographic projection of the fifth via hole on the substrate.

5. The display panel according to claim 4, wherein the third sub-wire portion, the fourth sub-wire portion and the first auxiliary portion at the first metal layer are insulated from one another;

the first sub-wire portion, the second sub-wire portion, the first bridge portion and the third auxiliary portion that are at the third metal layer are insulated from one another; and the first auxiliary portion, the second auxiliary portion, the third auxiliary portion and the fourth auxiliary portion are insulated from one another.

6. The display panel according to claim 4, further comprising pixel units arranged in an array, wherein each of the pixel units comprises a drive circuit and a storage capacitor, the drive circuit comprises a thin film transistor, and the thin film transistor comprises:
an active layer on the substrate;
a first gate insulating layer on one side of the active layer away from the substrate, wherein the first insulating layer comprises the first gate insulating layer;
a first gate on one side of the first gate insulating layer away from the substrate, wherein the first metal layer comprises the first gate;
an interlayer insulating layer on one side of the first gate away from the substrate, wherein the third insulating layer comprises the interlayer insulating layer;
a source-drain layer on one side of the interlayer insulating layer away from the substrate, wherein the third metal layer comprises the source-drain layer;
a passivation layer on one side of the source-drain layer away from the substrate, wherein the fourth insulating layer comprises the passivation layer; and
a planarization layer on one side of the passivation layer away from the substrate, wherein the fifth insulating layer comprises the planarization layer.

7. The display panel according to claim 6, wherein the first via hole is a through hole at least penetrating the third insulating layer, the second via hole is a through hole at least penetrating the third insulating layer, the third via hole is a through hole at least penetrating the third insulating layer, the fourth via hole is a through hole at least penetrating the fourth insulating layer and the fifth insulating layer, and the fifth via hole is a through hole at least penetrating the third insulating layer.

8. The display panel according to claim 7, wherein the second wire further comprises a fifth sub-wire portion, and the fifth sub-wire portion is configured to transmit a reset signal.

9. The display panel according to claim 8, wherein a fifth sub-wire portion configured to transmit an $(m+1)^{th}$ row of reset signal is electrically connected to a third sub-wire portion configured to transmit an $m^{th}$ row of first gate signal by means of a third bridge portion, wherein m is an integer greater than or equal to 1.

10. The display panel according to claim 9, wherein the third bridge portion is at the third metal layer, the third bridge portion is provided with a seventh via hole and an eighth via hole, the seventh via hole is a via hole at least penetrating the third insulating layer to cause the third sub-wire portion configured to transmit the $m^{th}$ row of first gate signal to be electrically connected to the third bridge portion, and the eighth via hole is a via hole at least penetrating the third insulating layer to cause the fifth sub-wire portion configured to transmit the $(m+1)^{th}$ row of reset signal to be electrically connected to the third bridge portion.

11. The display panel according to claim 10, wherein the third bridge portion is electrically connected to the third auxiliary portion through the seventh via hole or the eighth via hole.

12. The display panel according to claim 6, wherein the first sub-wire portion and the second sub-wire portion are electrically connected to sources or drains of thin film transistors of different pixel units separately and are configured to transmit data signals.

13. The display panel according to claim 12, wherein the third sub-wire portion is electrically connected to the first gate of the thin film transistor and configured to transmit a first gate signal; and the fourth sub-wire portion is configured to transmit a light-emitting control signal.

14. The display panel according to claim 13, wherein a first bridge portion electrically connected to a fourth sub-wire portion configured to transmit an $(n+1)^{th}$ row of light-emitting control signal is electrically connected to a fourth sub-wire portion configured to transmit an $n^{th}$ row of light-emitting control signal by means of a second bridge portion, wherein n is an integer greater than or equal to 1.

15. The display panel according to claim 14, wherein the second bridge portion is at the third metal layer, the second bridge portion is provided with a sixth via hole, and the sixth via hole is a via hole at least penetrating the third insulating layer, to cause the fourth sub-wire portion configured to transmit the $n^{th}$ row of light-emitting control signal to be electrically connected to the second bridge portion.

16. The display panel according to claim 15, wherein the fourth sub-wire portion configured to transmit the $n^{th}$ row of light-emitting control signal is electrically connected to the second bridge portion through the sixth via hole, the first bridge portion and the second bridge portion that are electrically connected to the fourth sub-wire portion configured to transmit the $(n+1)^{th}$ row of light-emitting control signal are electrically connected to the fourth auxiliary portion jointly through the fourth via hole, and an orthographic projection of the sixth via hole on the substrate does not overlap an orthographic projection of the fourth via hole on the substrate.

17. The display panel according to claim 13, wherein orthographic projections of the fourth sub-wire portion and the winding area on the substrate do not overlap with each other, and the fourth sub-wire portion configured to transmit one row of light-emitting control signal is cut off in the winding area.

18. The display panel according to claim 6, wherein the storage capacitor comprises a first plate electrode and a second plate electrode, the first plate electrode is at the first metal layer, the second plate electrode is at the second metal layer, a second gate insulating layer is between the first plate electrode and the second plate electrode, and the second insulating layer comprises the second gate insulating layer.

19. A display device, comprising the display panel according to claim 1.

* * * * *